United States Patent
Gibson, Jr.

[11] Patent Number: 6,110,395
[45] Date of Patent: Aug. 29, 2000

[54] METHOD AND STRUCTURE FOR CONTROLLING PLASMA UNIFORMITY

[75] Inventor: Gerald W. Gibson, Jr., Simi Valley, Calif.

[73] Assignee: Trikon Technologies, Inc., Chatsworth, Calif.

[21] Appl. No.: 08/918,852

[22] Filed: Aug. 26, 1997

[51] Int. Cl.[7] ................................................. H05H 1/00
[52] U.S. Cl. ..................... 216/67; 427/571; 438/732; 156/345; 118/723 E; 204/298.37
[58] Field of Search ................. 156/345; 118/723 E; 427/571; 204/298.37; 438/732; 216/67

[56] References Cited

U.S. PATENT DOCUMENTS

| | | | |
|---|---|---|---|
| 4,842,683 | 6/1989 | Cheng et al. | 156/345 |
| 4,886,565 | 12/1989 | Koshiba et al. | 156/345 |
| 4,963,242 | 10/1990 | Sato et al. | 156/345 |
| 5,215,619 | 6/1993 | Cheng et al. | 156/345 |

*Primary Examiner*—Thi Dang
*Attorney, Agent, or Firm*—Skjerven,Morrill, MacPherson, Franklin & Friel LLP; Alan H. MacPherson; Theodore P. Lopez

[57] ABSTRACT

The present invention relates to a method and structure for controlling plasma uniformity in plasma processing applications. Electron thermal conductivity parallel and perpendicular to magnetic field lines differs by orders of magnitude for low magnetic fields (on the order of 10 gauss). This property allows the directing of heat flux by controlling the magnetic field configuration independent of ions since the effect of modest magnetic fields upon the transport of ions themselves is minimal. Heat is preferentially conducted along magnetic field lines with electron temperatures on the order of 0.1 to 1 eV/cm being sufficient to drive kilowatt-level heat fluxes across areas typical of plasma processing source dimensions.

6 Claims, 10 Drawing Sheets

METHOD AND STRUCTURE FOR CONTROLLING PLASMA UNIFORMITY

BACKGROUND OF INVENTION

1. Field of Invention

The present invention relates to a method and structure for controlling plasma uniformity in plasma-based surface processing applications. The present invention includes controlling plasma uniformity in a high density plasma deposition and etching apparatus such as described in U.S. Pat. No. 5,429,070 which is incorporated herein in its entirety by reference.

2. Related Art

Applications for the use of plasmas are widespread, and a particular application is in the area of semiconductor fabrication. Plasmas are used as dry etchants in both blanket and patterned etches. Such etches can exhibit good anisotropic and selective etching qualities, and particular plasma etches, such as reactive-ion etches, allow the etching of fine patterns with good dimensional control.

Uniformity is a critical issue in plasma etch systems. In a typical application, a layer of material is etched with the intention of stopping the etch on the layer underneath. As a general rule, plasma contact with the underlying layer is to be minimized. Furthermore, the profile of etched features depends critically upon the etch rate and the time (known as the over etch time) that the plasma is in contact with the feature after definition of the feature by the etching process. Nonuniform plasmas degrade the uniformity of the etch rate over the entire wafer surface, requiring increased over etch times to ensure complete removal of all material desired to be etched. Because the thickness of the layers is a constant for a given device, independent of the wafer size, the etch rate uniformity across the wafer becomes an increasingly rigorous criterion as wafer/substrate dimensions increase. The present de facto industry standard is a 5% uniformity variation from the mean at three (3) standard deviations over the wafer surface. Increases in the diameter of semiconductor wafers and further decreases in the thickness of thin films have made the need for uniform etching, and hence, uniform plasma densities even more important.

SUMMARY OF INVENTION

In accordance with this invention a method and structure for controlling plasma uniformity in plasma etching applications are disclosed. The basis of the method and structure for controlling plasma uniformity is the recognition that the electron thermal conductivity parallel and perpendicular to the magnetic field lines differs by orders of magnitude for low magnetic fields (on the order of 10 gauss). The effect of magnetic fields of modest strength upon the transport of ions (i.e. the effects on the continuity and momentum equations) is minimal due to their comparatively high inertia with respect to the electrons. The comparatively high inertia of the ions with respect to the electrons allows directing the heat flux independent of the ions by controlling the magnetic field configuration. Heat is preferentially conducted along the magnetic field lines with electron temperature gradients driving the heat fluxes. By controlling magnetic field structure, heat fluxes can be driven across areas over the entire range of pressures and plasma densities generally encountered in high density plasma processing applications. In the context of plasma processing of materials, plasmas with densities greater than or equal to $10^{11}$ ions/cm$^3$ are considered to be high density plasmas although this definition may vary depending on the application.

By using permanent magnets, magnetic field coils or both permanent magnets and magnetic field coils, a magnetic field that is essentially parallel to the wafer may be set up in a process chamber in the vicinity of the wafer to allow a uniform plasma to be achieved across the wafer surface.

In accordance with this invention, control of plasma uniformity has been demonstrated at high pressure, an environment where standard MORI (M =0 Resonant Induction) technology has not allowed for significant control of plasma uniformity. A highly flared magnetic field which runs substantially parallel to the wafer surface at large radii and allows a preferential radial flow of ionizing energy is used in accordance with an embodiment of this invention to control plasma uniformity.

The method and structure for controlling plasma uniformity in accordance with this invention possess a number of advantages. For example, low magnetic fields (on the order of 10 gauss) minimize plasma-induced device damage occurring from potential variations created across magnetic field lines on the wafer surface. For example, potential variations cause damage to thin gate dielectric components. Further, low magnetic fields allow for the use of less expensive magnets and current supplies. Also, the use of magnetic fields to control plasma thermal conductivity makes practical the design of a uniform plasma ab initio.

This invention is applicable to any plasma source regardless of the means of plasma generation. However, additional MORI-specific advantages include, for example, the ability to create compact flat-plate, single loop designs that allow efficient distribution of the localized power injected by a MORI single-loop type antenna, whether that antenna be located externally or internally with respect to the vacuum vessel wall.

DETAILED DESCRIPTION OF INVENTION

In accordance with various embodiments of this invention, plasma uniformity may be controlled in plasma processing applications. For a cylindrical plasma source, such as, for example, a MORI source, the plasma uniformity is defined in terms of the plasma density over a circular cross-section at a specified axial position (i.e. a plane whose normal is parallel to the cylinder's axis). Plasma non-uniformity is numerically defined (in the range from 0 (zero) to 1 (one)) as:

(maximum plasma density in the plane minus minimum plasma density in the plane) divided by (twice the average plasma density in the plane).

Hence, plasma uniformity is defined numerically as: 1 (one) minus the plasma non-uniformity. Plasma uniformity is correlated with etch rate uniformity. Plasma etching relies upon energetic ions to aid in the etching process. Hence, a correlation exists between the plasma uniformity (indicated by the ion saturation current) just above the wafer surface and the etch rate uniformity on the wafer.

Figure 1:
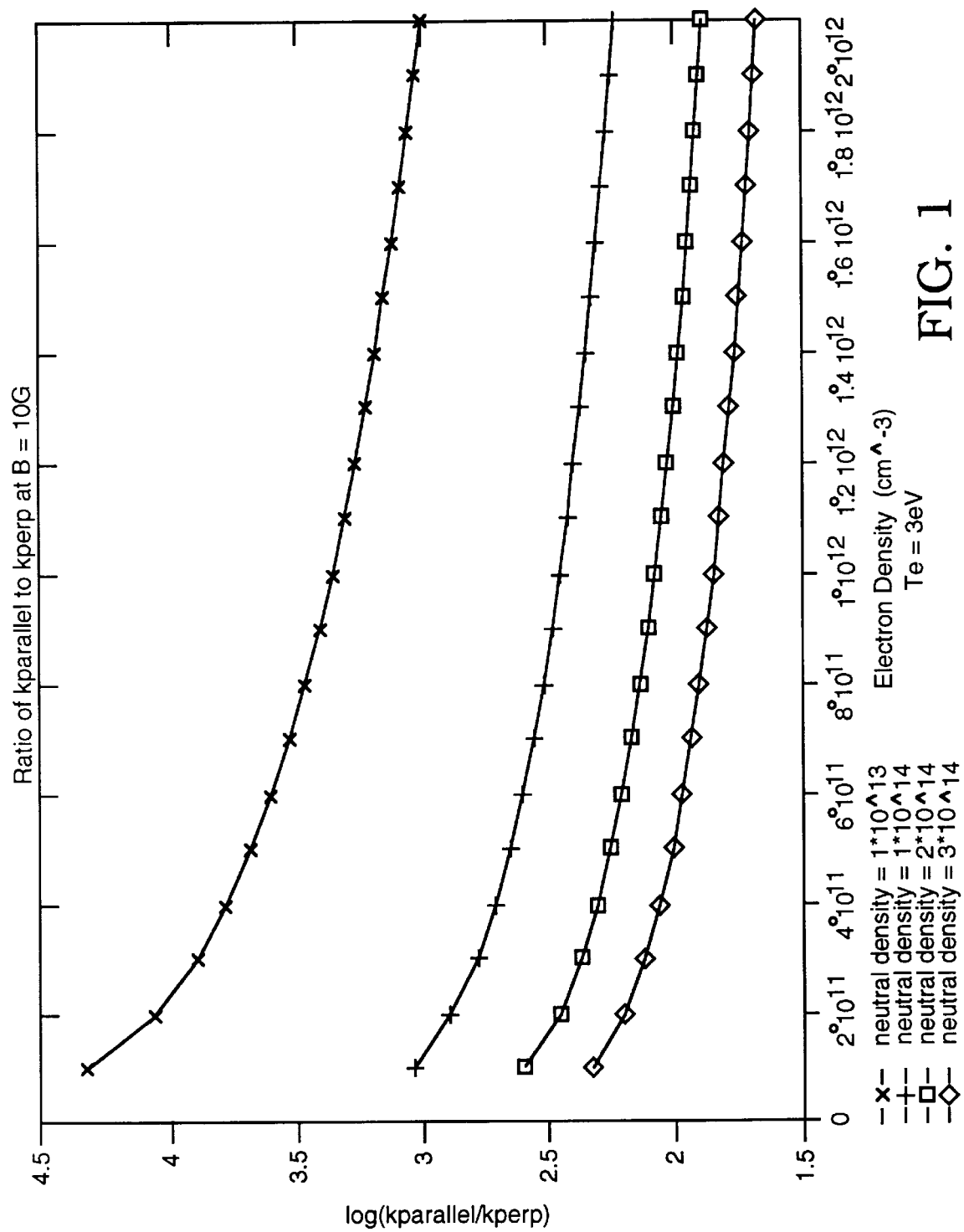
FIG. 1 shows a graph of the ratio of electron thermal conductivity parallel and perpendicular to magnetic field lines for a set magnetic field of 10 G, as a function of plasma density for argon neutral densities from $10^{13}$ to $3 \times 10^{14}$ cm$^{-3}$ in the MORI apparatus in accordance with an embodiment of this invention.

The method and structure for controlling plasma uniformity involves the recognition that the electron thermal conductivity parallel and perpendicular to the magnetic field lines differs by orders of magnitude for modest magnetic fields as shown by the graph in FIG. 1. FIG. 1 shows a graph of the base 10 logarithm of the ratio of thermal conductivity along the magnetic field lines to thermal conductivity across the magnetic field lines at a magnetic field strength of 10 G and an electron temperature of 3 eV for the MORI apparatus shown in FIGS. 2a and 2b. The graph covers the typical range of neutral pressures and plasma densities for high density plasmas. The graph shows that as the electron density increases, the ratio of thermal conductivity along the magnetic field lines to the thermal conductivity across the magnetic field lines decreases for a given density of neutral particles. This ratio also decreases as the neutral particle density increases. The transport coefficients used to obtain FIG. 1 are calculated exactly from the equation of motion for the electron distribution function using the finite-Larmor-radius (FLR) perturbative expansion and the appropriate collision operators for electron-ion and electron-neutral collisions (see Appendix A for details).

The thermal conductivity along magnetic field lines is extremely high and depends only on electron temperature. Small temperature gradients can serve to drive substantial heat fluxes as shown in FIG. 3. FIG. 3 is a graph of the electron temperature gradient needed along the magnetic field lines to drive a heat flux of 1000 W across an area of 81 cm$^2$ (equal to the area of the circular cross section of bell jar 210 shown in FIG. 2a) for a range of argon gas neutral pressures and plasma densities that are typical of high density plasma processing (see Appendix A for equations). FIG. 3 shows that for a given neutral density, the gradient needed along the magnetic field lines to drive 1 KW of heat flux across 81 cm$^2$ decreases as electron density increases. However, as the neutral density reaches approximately $3 \times 10^{14}$/cm$^3$ and the electron density reaches $1.2 \times 10^{12}$/cm$^3$, further increases in electron density have little effect on this gradient. The effect of modest magnetic fields on the order of 10 G upon the transport of the ions (i.e. the effects on continuity and momentum equations) is minimal. Therefore, heat flux may be directed independently of the ions. By directing the heat flux along the magnetic field lines in accordance with this invention, the ionization source function (the spatial distribution of ion production) can be altered to regulate plasma uniformity. The magnetic field, used in this capacity, serves a function identical to that of the copper cladding found on the bottom of some frying pans; the copper cladding takes a local heat concentration and spreads it uniformly across the area where the chemical processing (e.g. frying a pork chop) takes place. Similarly, the plasma temperature is uniformly distributed along the magnetic field lines parallel to the wafer surface.

Figure 2A:
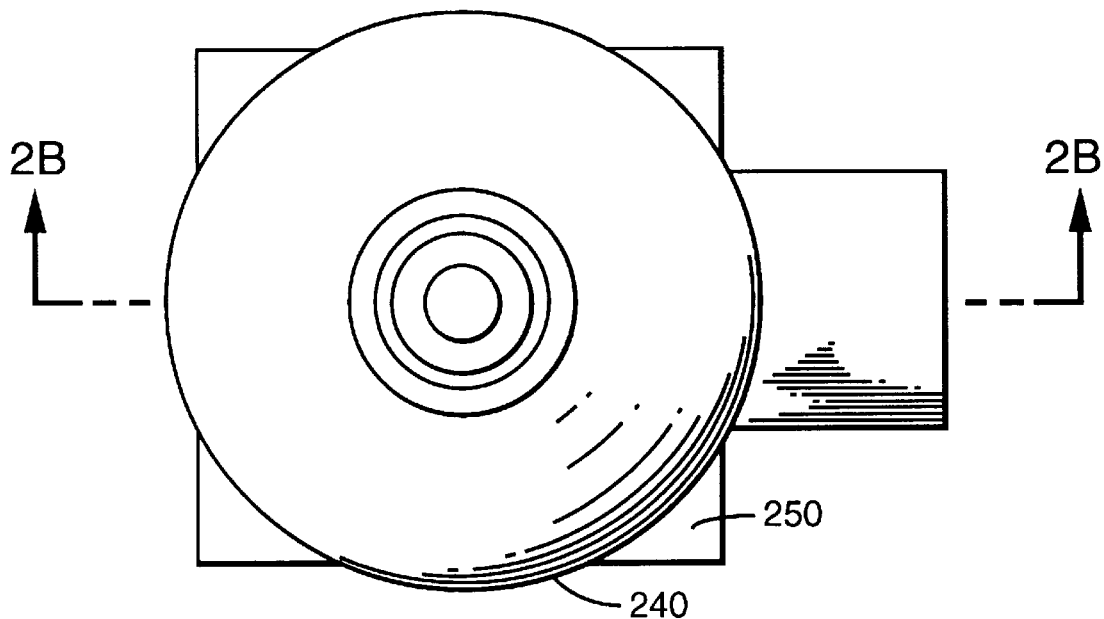
FIG. 2a shows a top view of a MORI apparatus configured with pancake coils in accordance with an embodiment of this invention.
Figure 2B:
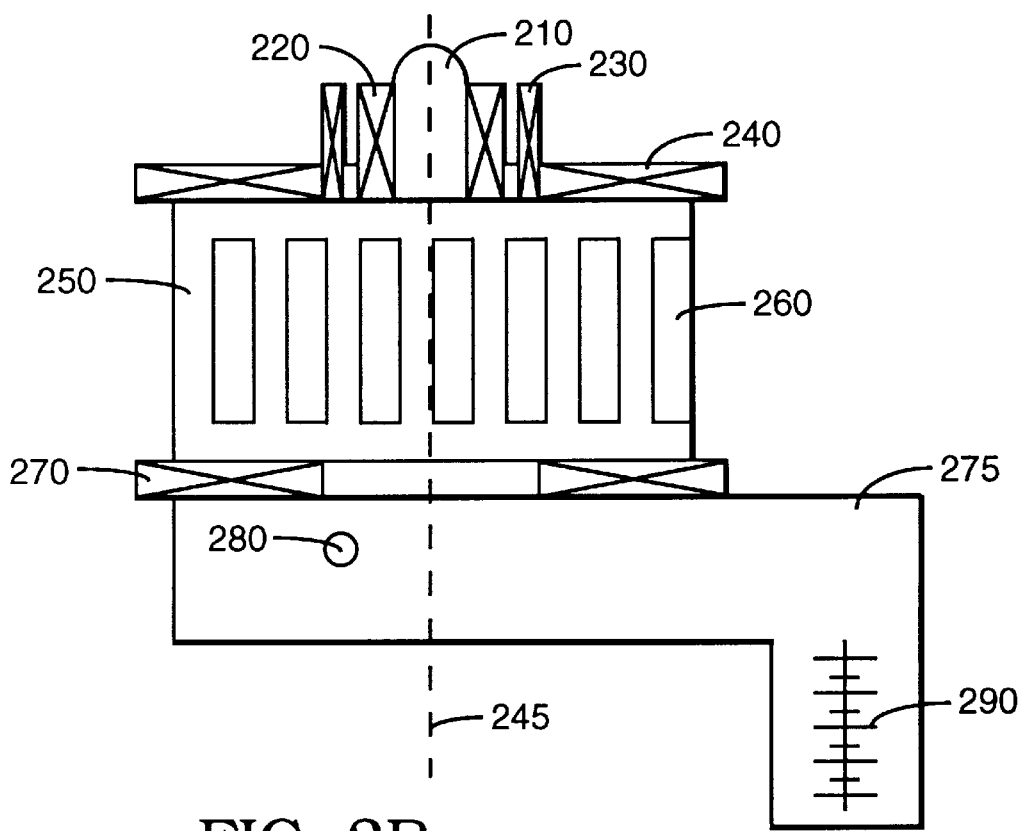
FIG. 2b shows a side view of a MORI apparatus configured with pancake coils in accordance with an embodiment of this invention.
Figure 3:
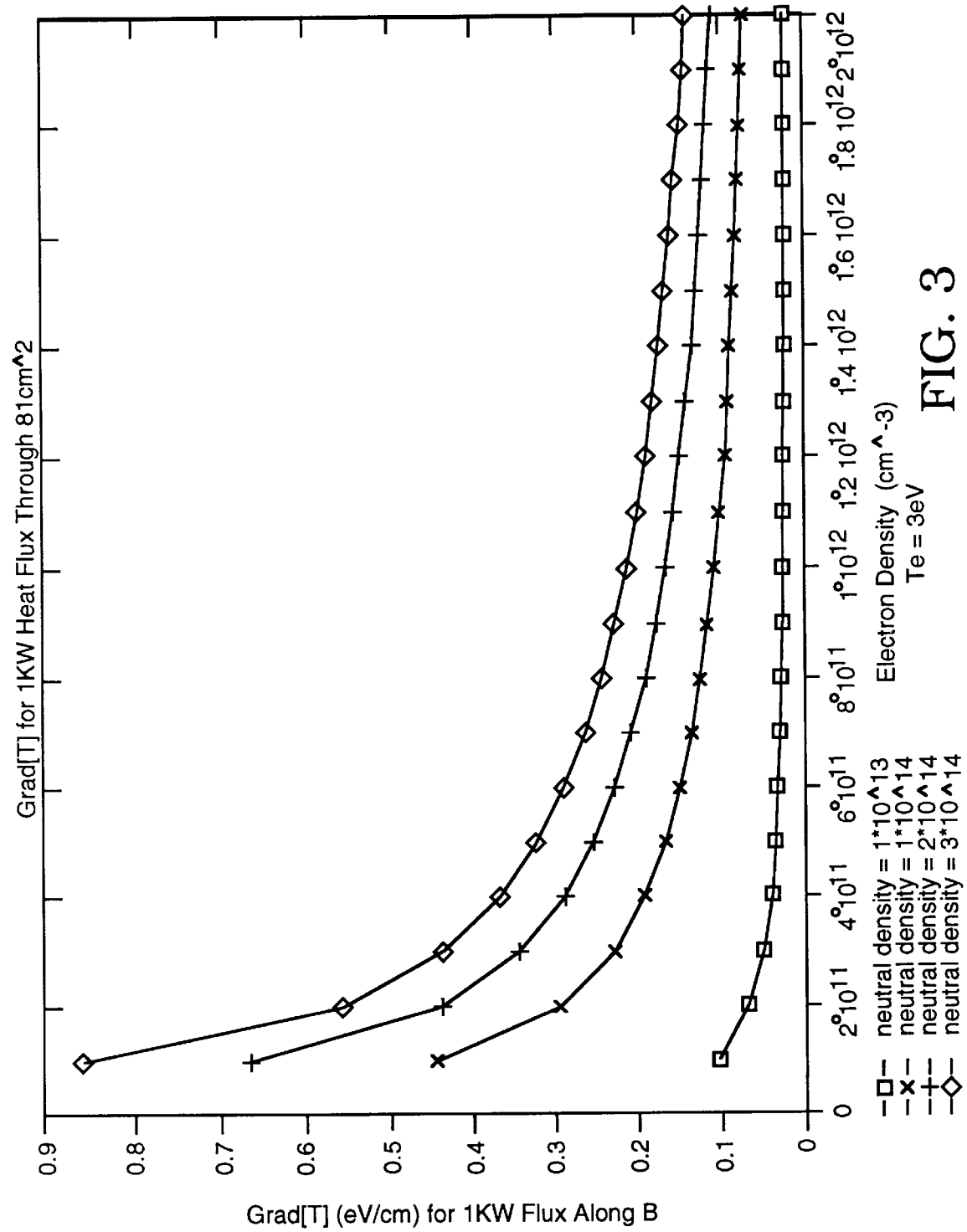
FIG. 3 shows a graph of the electron temperature gradient necessary to drive a heat flux of 1000 W parallel to the magnetic field across an area equal to that of the bell jar mouth (81 cm$^2$) in accordance with an embodiment of this invention. The gradient is given as a function of electron density and Ar neutral density (cm$^{-3}$).

FIGS. 2a and 2b show one embodiment in accordance with this invention. FIG. 2a shows a top view of a standard MORI apparatus modified in accordance with this invention (see, for example, U.S. Pat. No. 5,429,070 for details regarding the MORI apparatus, hereby incorporated by reference in its entirety). Bell jar 210 is encircled by two concentric MORI magnets 220 and 230 which in turn are encircled by an upper pancake coil 240. MORI magnets 220 and 230 and pancake coil 240 are positioned on top of 450 mm square magnetic bucket 250 operating at 10 mTorr. FIG. 2b shows a side view of the MORI apparatus in FIG. 2a. Permanent magnets 260 are placed around square magnetic bucket 250 for enhanced plasma confinement. Standard MORI process module 275 supports square magnetic bucket 250 and bell jar 210. Pumping is accomplished by 1000 l/s turbo pump 290 (such as, for example, a Leybold turbo pump) via a standard MORI pumping elbow having a 3600 l/s conductance. Gas in port 280 is located on standard MORI process module 275.

Figure 4:
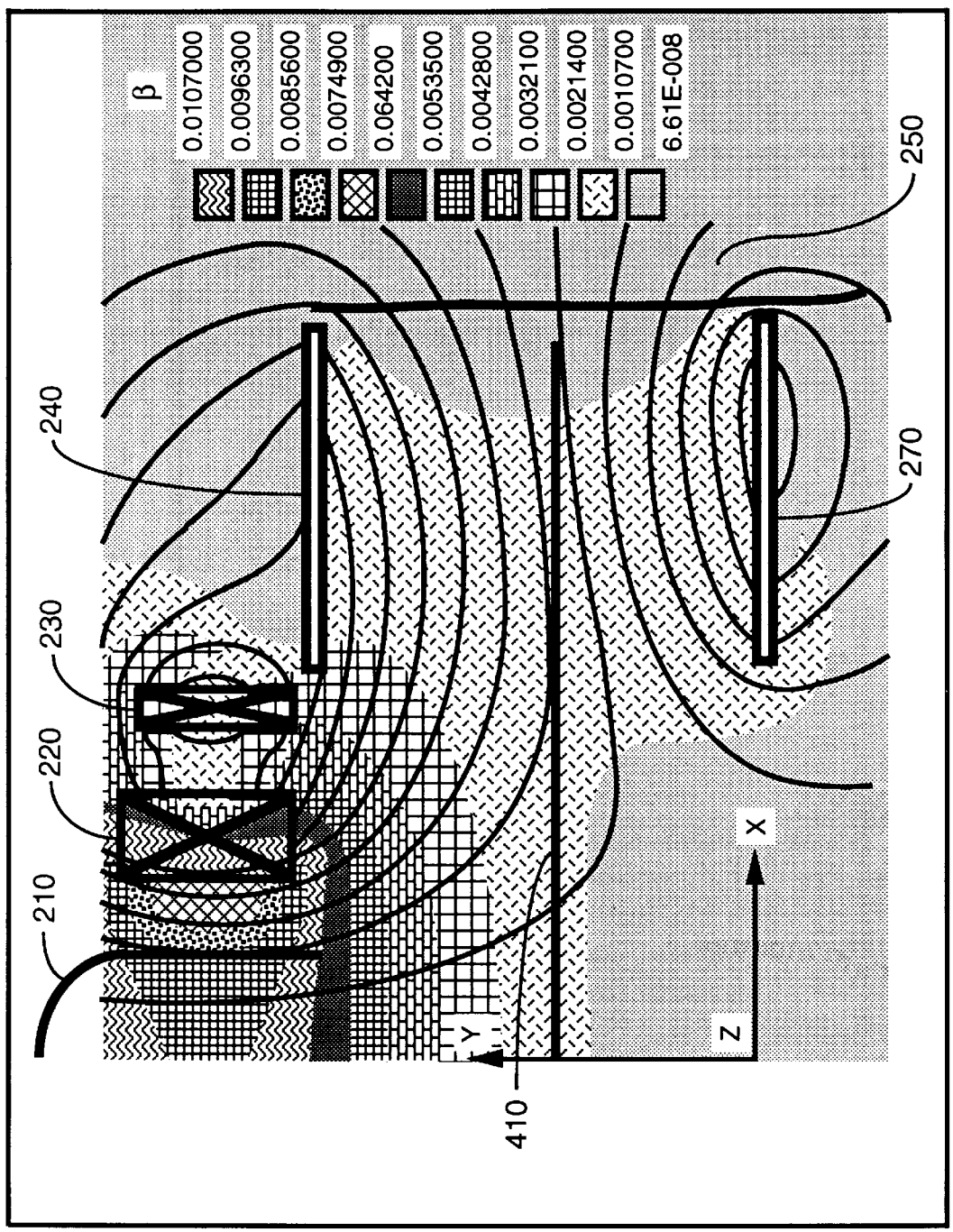
FIG. 4 shows an embodiment in accordance with this invention showing field lines coming out of the MORI bell jar bent by two pancake coils and a MORI inner coil.

Below square magnetic bucket 250 is pancake coil 270 which is operated with a current running in the opposite sense to the current in pancake coil 240. This serves to set up a bucking or cusp configuration. In an alternative embodiment in accordance with this invention only lower pancake coil 270 is energized to generate a magnetic field that opposes MORI inner coil 220. The configuration of pancake coils 240 and 270 serves to generate a magnetic field geometry within square magnetic bucket 250 which is everywhere substantially radial except in the immediate vicinity of the radial symmetry axis 245 of the coils 240 and 270. The highly flared magnetic field in square magnetic bucket 250 runs essentially parallel to the wafer surface at large radii (>100 mm) and thus provides for a preferentially radial flow of ionization energy. The magnetic field is more normal to the wafer at smaller radii (<100 mm). The resulting magnetic field achieved by the coil configuration is shown in FIG. 4. Fields coming out of bell jar 210 are bent to run approximately parallel to wafer surface 410 by pancake coils 240 and 270 and MORI inner coil 220. In accordance with one embodiment of this invention, only MORI inner coil 220 is energized. Upper pancake coil 240 generates a magnetic field oriented in the same direction as MORI inner coil 220 while lower pancake coil 270 generates a magnetic field that opposes coils 220 and 240.

Figure 5:
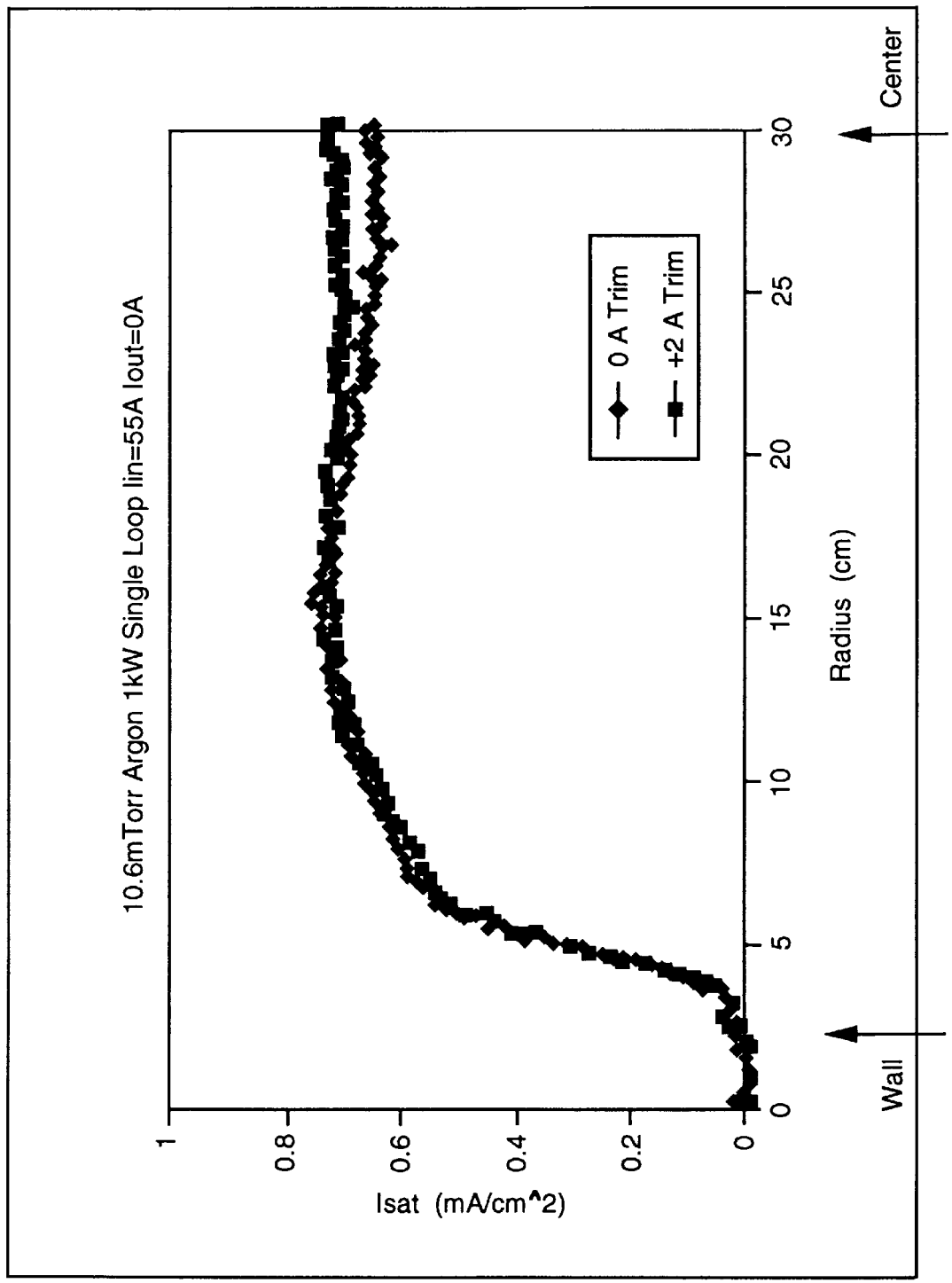
FIG. 5 shows a graph of saturation current density versus position at a pressure of 10 mTorr and 1000 W of MORI power in an embodiment in accordance with this invention.
Figure 10:
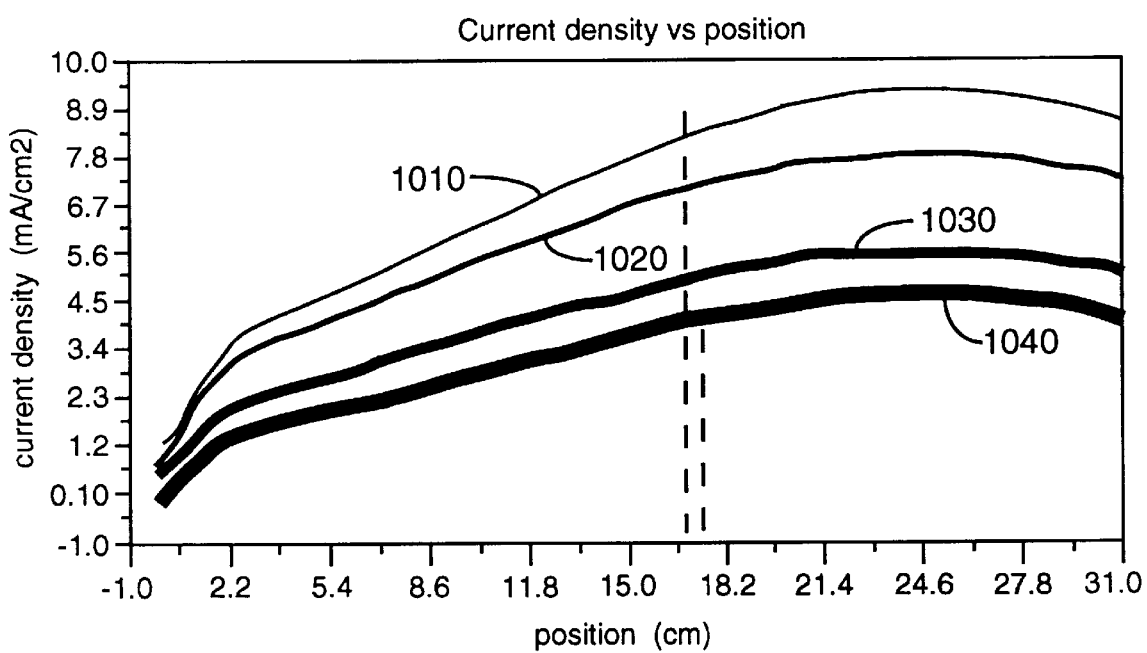
FIG. 10 shows a graph of current density of 10 mTorr and 1500 W of MORI power in an unsuccessful attempt to control plasma uniformity using prior art.

Ion saturation current density is an indicator of plasma density. FIG. 5 shows a graph of ion saturation current density versus radius at a pressure of 10.6 mTorr with 1500 W of power supplied to the MORI antenna with the curves a and b corresponding to magnetic field generation by MORI inner coil 220 alone at a current of 55 amps, and with upper and lower pancake coils 240 and 270 also being energized at 0 amps and 2 amps, respectively. FIG. 5 shows the control of plasma uniformity which is afforded by use of two pancake coils at a pressure of 10.6 mTorr. The graph in FIG. 10 shows ion saturation current versus radius at a pressure of 10 mTorr and 1500 W of MORI power in an unsuccessful attempt to control uniformity using only standard MORI magnets with a magnetic field of 50 gauss in the chamber. The vertical lines indicate the radius out to which 10% non-uniformity ((max−min)/average) is maintained. Line 1010 plots current density versus radius for a current of 17 amps in the MORI inner coil and no current in the outer MORI coil; line 1020 plots current density versus radius for a current of 21 amps in the MORI inner coil and 21 amps in the MORI outer coil; line 1030 plots current density versus radius for a current of 31 amps in the MORI inner coil and 61 amps in the MORI outer coil; and line 1040 plots current density versus radius for a current of 20 amps in the MORI inner coil and 60 amps in the MORI outer coil.

Using the radial and axial electron temperature and density profiles obtained in the MORI source for argon, and the well-established cross-sections for this gas, the spatial distribution of ionization or "ionization source function" can be estimated. The calculation of the spatial distribution of ionization shows that over the range of MORI operating conditions, 85–95% of the ionization (see FIG. 6) occurs in the magnetic bucket region where the magnetic fields are relatively weak.

Figure 6A:
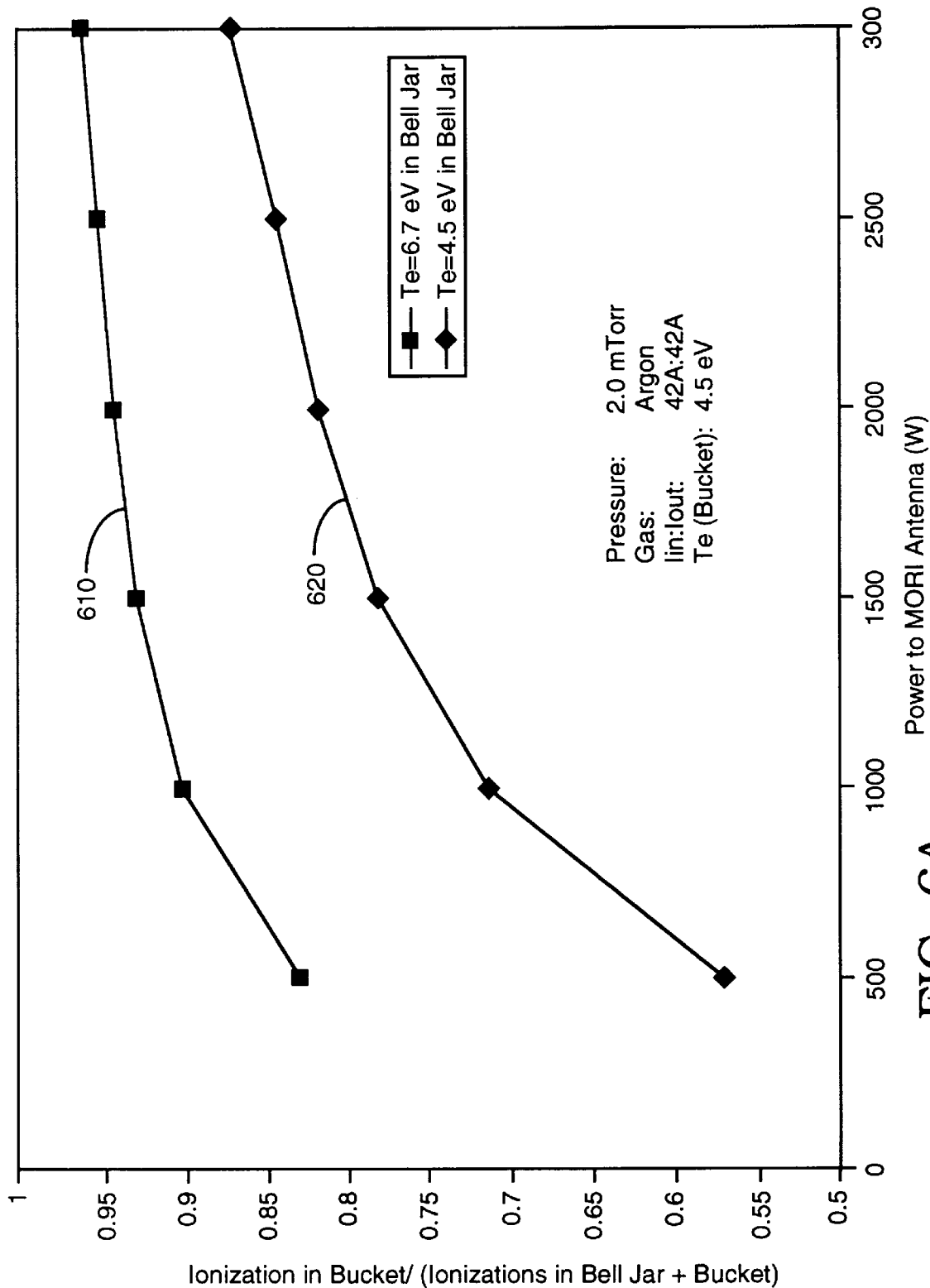
FIG. 6a shows a graph of the fraction of particles created in the MORI magnetic bucket as a function of source power for constant pressure in an embodiment in accordance with this invention.
Figure 6B:
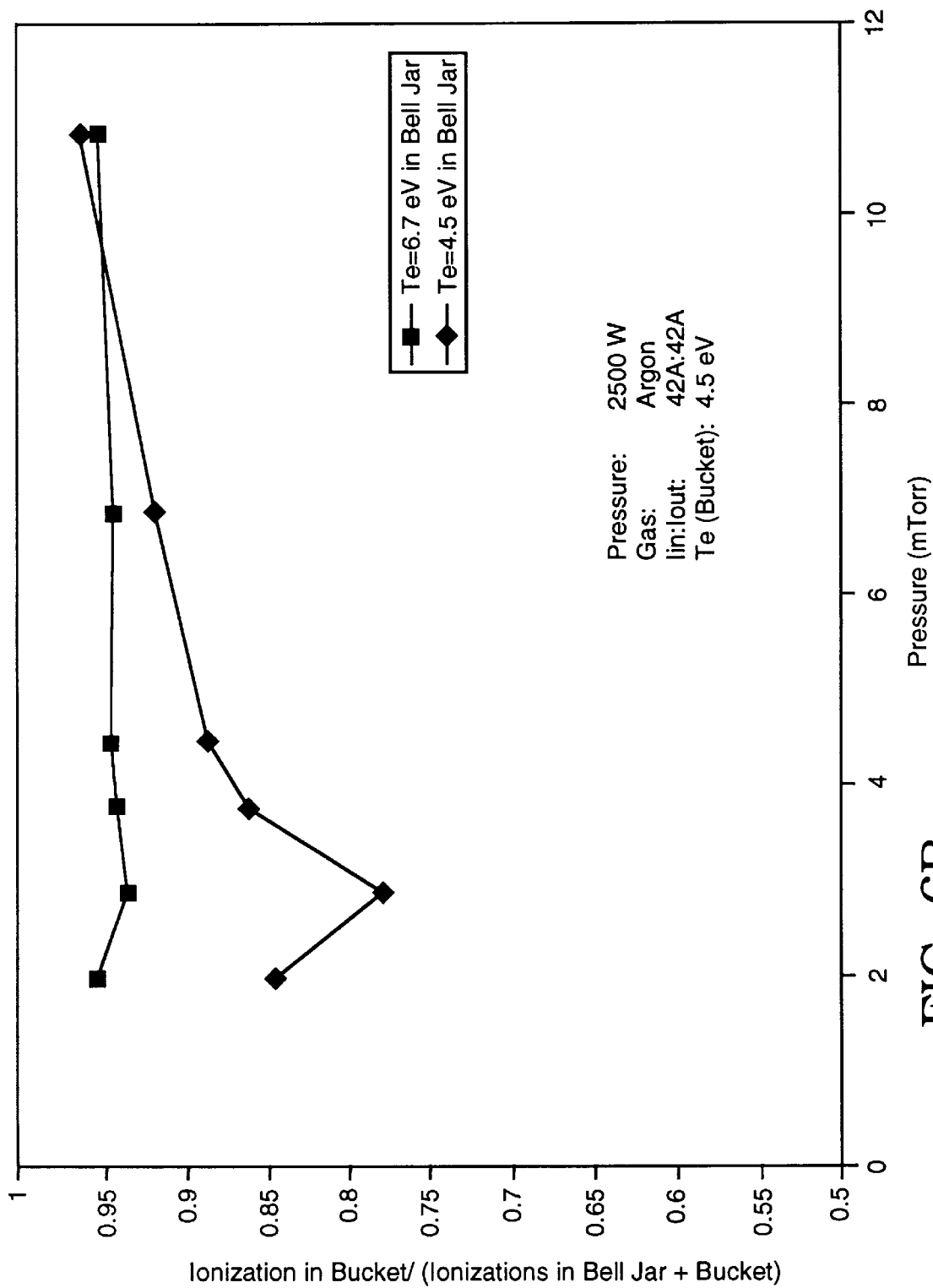
FIG. 6b shows a graph of the fraction of particles created in the MORI magnetic bucket as a function of pressure at constant source power in an embodiment in accordance with this invention.

FIG. 6 shows a graph of the fraction of particles created in the magnetic bucket portion of the reactor (i.e., the ratio of the number of particles created in the magnetic bucket to the total number of particles created in the magnetic bucket and the bell jar) as a function of the MORI antenna power at a pressure of 2 mTorr for experimentally determined electron temperature curves 610 and 620 in bell jar 210. Hence, FIG. 6 indicates that the "steering" by the magnetic field of the ions which originate in bell jar 210 represents only a higher order effect in the control of plasma uniformity by MORI magnets 220 and 230. The majority of ion production occurs in square magnetic bucket region 250 even with higher (6.7 eV) electron temperatures in bell jar 210. Furthermore, for a constant plasma density, the amount of plasma created in a magnetic bucket simply scales as its volume, which implies a radius-squared dependence for the amount of plasma created in a magnetic bucket for equal height buckets. Thus, for larger magnetic buckets such as those required for 300 mm diameter silicon wafers or flat panel displays, the transport of particles generated in the bell jar into the magnetic bucket has negligible influence upon the plasma uniformity in the magnetic bucket.

Figure 8:
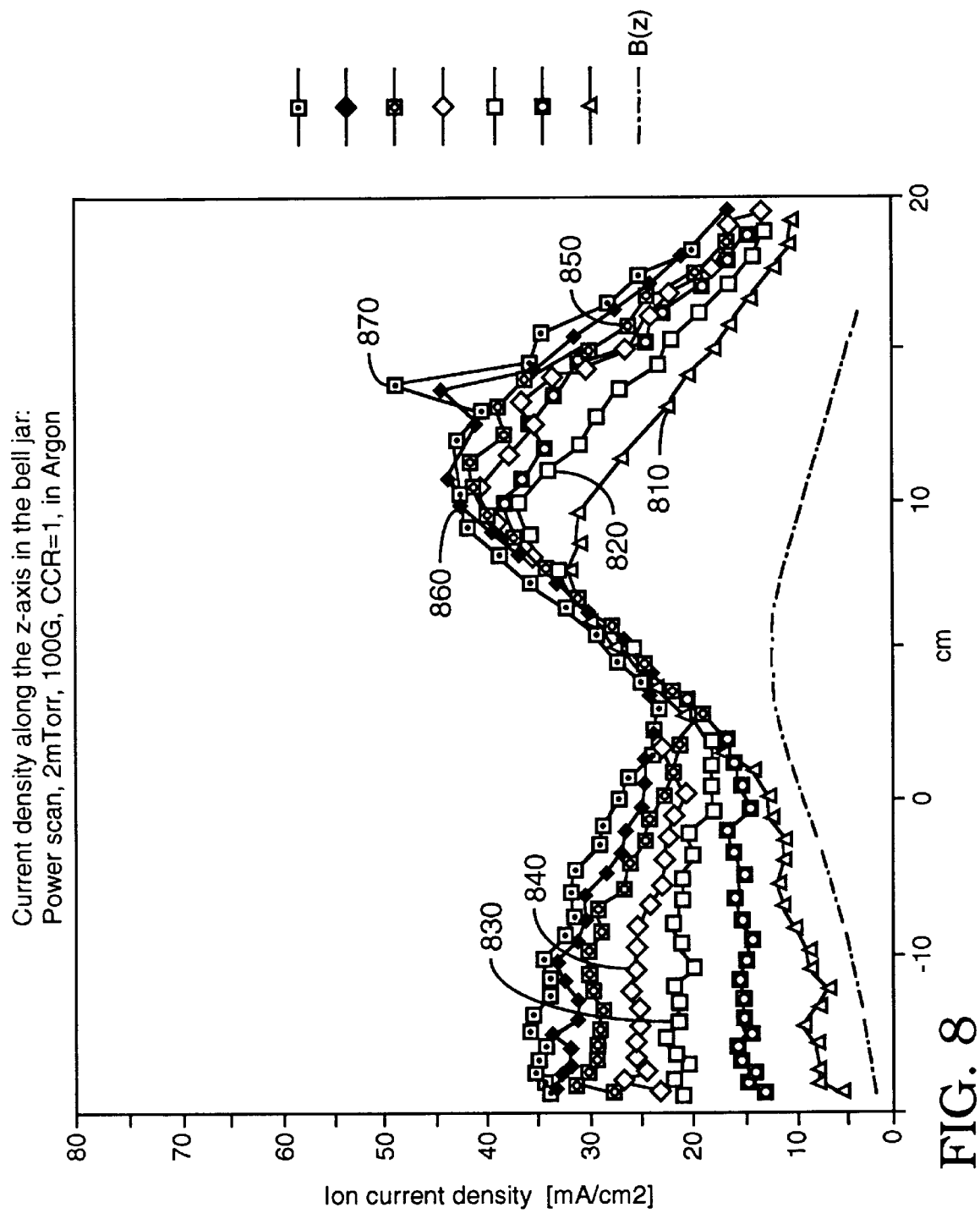
FIG. 8 shows a graph of the ion saturation current density along the z-axis in the MORI bell jar and MORI magnetic bucket regions using argon gas at various power levels with a pressure of 2 mTorr, a magnetic field of 100 G, and a ratio of inner coil current to outer coil current (CCR) of 1.

A second important feature of the data taken along axis of symmetry 245 is the power dependence of the plasma density in the magnetic bucket region. Above a MORI power level somewhere between 500 W and 1000 W, the bell jar plasma density ceases to increase, while the average magnetic bucket plasma density increases monotonically as shown in FIG. 8. The graph in FIG. 8 shows the ion density along axis of symmetry 245 in bell jar 210 and square magnetic bucket 250 at various MORI antenna power levels for argon gas at a pressure of 2 mTorr. Lines 810–860 correspond to an applied power of 500–3000 W in 500 W steps, respectively, with line 870 corresponding to an applied power of 3300 W. The magnetic field set up by the MORI coil currents is 100 G at center 215 of the magnet assembly. FIG. 8 shows that the helicon mode absorbs radio frequency (RF) power delivered to the antenna and efficiently transmits that power to square magnetic bucket 250 via small temperature gradients, since the increase of density with power in large volume square magnetic bucket 250 is roughly three times that in bell jar 210.

Figure 7:
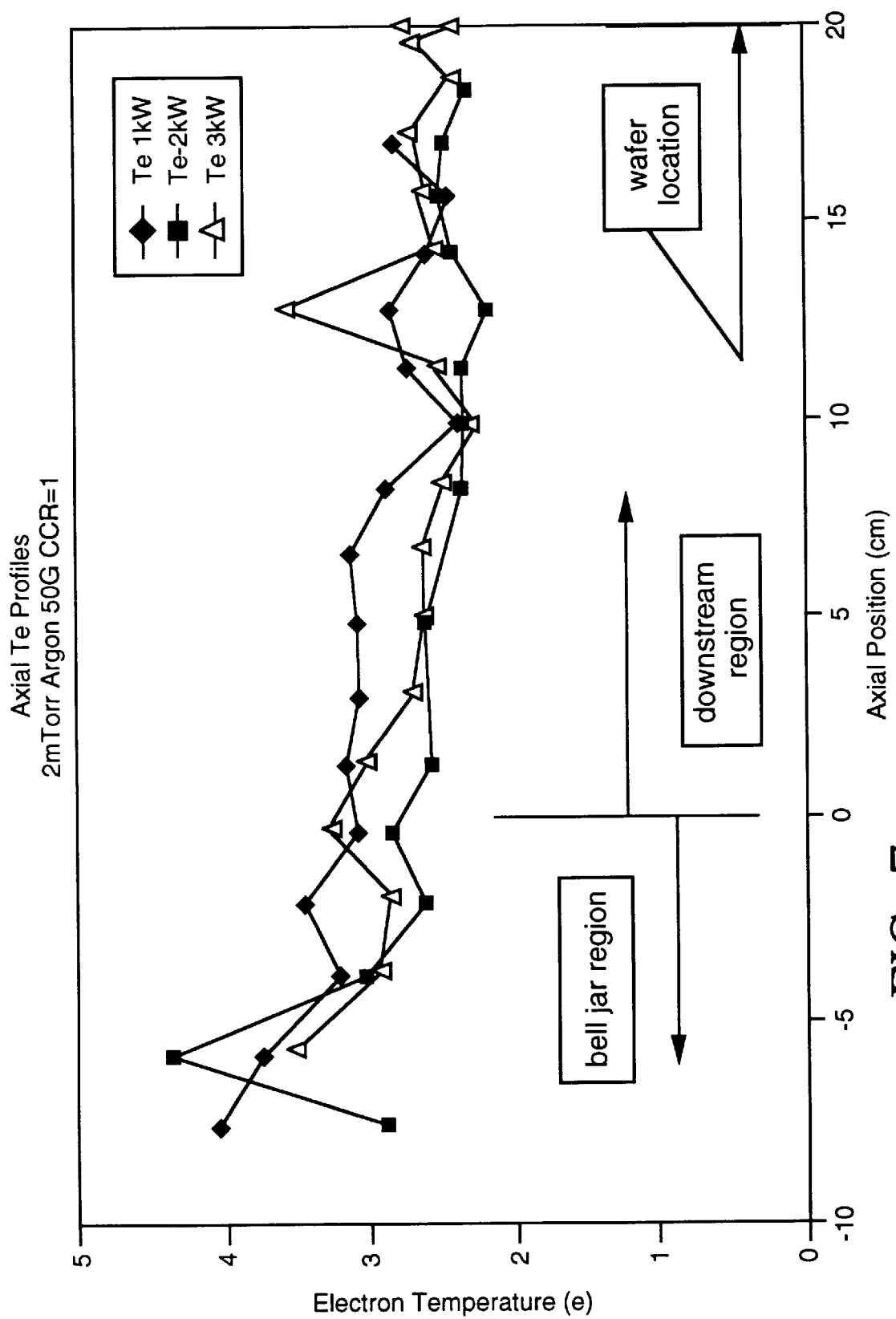
FIG. 7 shows an experimental measurement of electron temperature along the MORI source axis for one embodiment in accordance with this invention for 3 different power levels.

The thermal conductivity along magnetic field lines is extremely high and depends only upon electron temperature. A temperature gradient of the order of 0.1 to 1 eV/cm can drive kilowatt-level heat fluxes across the (circular) cross-sectional area of a bell jar as indicated by the graph in FIG. 3. FIG. 7 shows that such gradients exist in bell jar 210 when power absorption occurs primarily in the bell jar region.

There are several generic advantages to the controlling of plasma uniformity via electron heat flux manipulation. First, the low magnetic fields invention (on the order of 10 gauss) used in accordance with the present minimize plasma-induced device damage to thin gate dielectrics occurring from wafer surface potential variations that are set up across magnetic field lines. Second, the lower the magnetic field, the less expensive are the magnets and current supplies. Third, the use of magnetic fields to control plasma thermal conductivity opens up the possibility of ab initio design of a uniform plasma. If one tries to control uniformity by altering the transport of plasma particles, one is always faced with the problem that electrons and ions transport across magnetic fields at different rates, but are coupled in a non-trivial manner through their coulomb field attraction. There is no such coupling of the electron and ion heat equations so that only the equation for electron energy transport needs to be solved. Furthermore, if the magnetic fields are kept sufficiently low, the electron and ion fluxes continue to be controlled by ambipolar diffusion (where the diffusion coefficient for a plasma, dominated by collisions of the charged particles with the neutral particles, is twice the free diffusion coefficient) and only a single charged particle transport equation having scalar coefficients must be solved. The system of equations is closed by adding an equation for neutral transport. Solving such a system of equations is a non-trivial but tractable task. A Green's function approach may be used to calculate spatial electron temperature variation for a specified off-axis power deposition profile to allow for an ab initio design.

There are additional MORI-specific advantages which may be realized by the above embodiments. A dense plasma can be created using the two pancake coils only (i.e., neither of the standard MORI coils is energized). This configuration lends itself to a flat plate, single loop design which has major engineering advantages over the present bell jar design. The antenna loop may be mounted externally or internally with respect to the vacuum chamber. The single loop antenna deposits power further off axis of symmetry 245 than a double loop antenna which improves the inherent uniformity of the source, in agreement with results from Green's function calculations which investigate the effects of off-axis power coupling. Implementation of the single loop flat plate is compact and efficiently distributes the localized power deposition of a single-loop antenna of standard diameter. Table 1 shows the typical operating range of one embodiment in accordance with this invention.

TABLE 1

| | |
|---|---|
| MORI Power (watts) | 500–5000 |
| Lower Pancake Coil (amps) | 0–10 |
| Upper Pancake Coil (amps) | 0–10 |
| Bias Power (watts) | 0–5000 |
| Neutral Pressure (mTorr) | 1–20 |
| Inlet gas flow (sccm) | 50–1000 |

In one embodiment, for example, where a polysilicon wafer etch is performed using a 20 cm chuck, upper pancake coil 240 and lower pancake coil 270 are each energized to 2 amps, a run bias of 100 watts is applied to the chuck at a MORI power of 1500 watts, a pressure of 3 mTorr is set and an inlet gas flow rate of 100 sccm is provided.

The use of magnetic fields to control the flow of heat, and thus tailor plasma uniformity represents a fundamental departure from past efforts to control plasma uniformity by altering particle flow. Indeed, where attempts to alter particle flow have met with moderate success, a significant or dominant contribution to controlling plasma uniformity has been made by alteration of the plasma's thermal conductivity tensor.

Figure 9A:
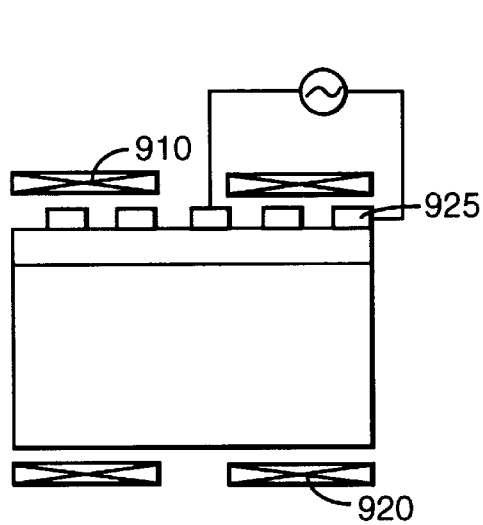
FIG. 9a shows a Transformer Coupled Plasma apparatus configured with two pancake coils in an embodiment in accordance with this invention.
Figure 9B:
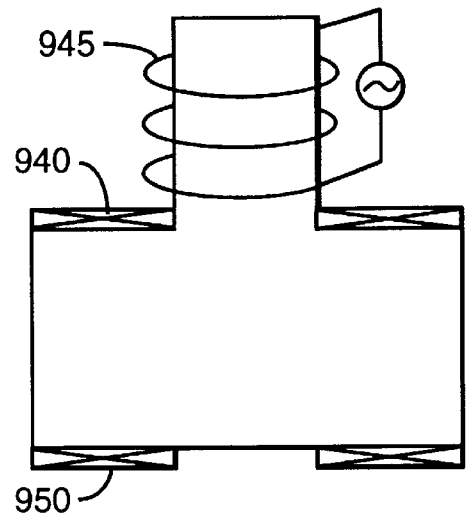
FIG. 9b shows a Helical Resonator apparatus configured with two pancake coils in an embodiment in accordance with this invention.

The method and structure for controlling plasma uniformity which has been described herein is not limited to MORI plasma generation means and can be applied to any plasma source regardless of the means of plasma generation. FIGS. 9a and 9b show two embodiments in accordance with this invention applied to two commercial plasma sources. FIG. 9a shows a Transformer Coupled Plasma (TCP) (manufactured by Lam Research) which utilizes a planar spiral coil 925 to effect inductive coupling of radio frequency power into a plasma that is configured with pancake coils 910 and 920. FIG. 9b shows a Helical Resonator (manufactured by Prototech, Inc.) which utilizes a helical winding 945 to inductively couple radio frequency power into a plasma that is configured with pancake coils 940 and 950. In both cases the configuration of the two pancake coils is operated in a bucking configuration (current directions in the two pancake coils are opposite) and the currents are selected to give fields in the region between the coils of about 1–10 gauss. It may be desirable to energize only lower pancake coils 920 and 950 in the respective configurations as the lower pancake coil alone can generate a substantially radial magnetic field and there exists the possibility of a perturbation of the radio frequency coupling by the magnetic field generated by upper coils 910 and 940, respectively.

The various embodiments of the structure and method of this invention that are described above are illustrative only of the principles of this invention and are not intended to limit the scope of the invention to the particular embodiments described. Many additional and alternative embodiments are in the scope of this invention as defined by the following claims.

Appendix A

The calculation for conductivity parallel and perpendicular to the magnetic field is based on the equation of motion for the distribution function f (Equation 1) which is the fundamental equation of kinetic theory. The calculation assumes steady state conditions so that, e.g., stochastic effects from rapidly oscillating electric fields are ignored. The interparticle collision operators (Equations 2 and 3) which give rise to particle and thermal transport, account for both electron-ion collisions and electron-neutral collisions. The expressions obtained are valid over the entire range of plasma processing conditions. The method of solution of Equation 1 is the Finite Larmor Radius (FLR) expansion and utilizes the ratio of the electron gyro-radius to the transport gradient length as the expansion parameter. The expansion parameter is extremely small for processing plasmas immersed in magnetic fields of 10 gauss or more. The commonly made auxiliary assumption that the electron gyro-frequency is much larger than the electron collision frequency is not made in calculating the parallel and perpendicular thermal conductivity coefficients.

$$\frac{\partial f}{\partial t} + \overline{v} \cdot \nabla f - \frac{e}{m_e}[\overline{E} + \overline{v}x\overline{B}] \cdot \nabla_v f = C(f) \tag{1}$$

where $\overline{E}$ is the electric field, $\overline{v}$ the velocity vector, $\overline{B}$ the magnetic field and $C(f)$ is given by:

$$C(f) = \nu_{ei}L(f) - \nu_{eo}(f - f_m) \tag{2}$$

$\nu_{ei}$ is the electron-ion collision frequency and $\nu_{eo}$ is the electron-neutral collision frequency. $L(f)$ is given in spherical angular coordinates by:

$$L = \frac{1}{2\sin\theta}\frac{\partial}{\partial\theta}\sin\theta\frac{\partial}{\partial\theta} + \frac{1}{2\sin^2\theta}\frac{\partial^2}{\partial\phi^2} \tag{3}$$

where $f_m$ is the Maxwell distribution function and $f$ is the perturbed distribution function. The partial derivative with respect to time vanishes for the steady state giving the equation:

$$\Omega_e\frac{\partial f}{\partial\phi} = \overline{v} \cdot \nabla f + \frac{e}{m_e}\overline{E} \cdot \nabla_v f + C(f) \tag{4}$$

where $\Omega_e$ is the electron cyclotron frequency, +e,fra v+ee the velocity vector, the electric field $\overline{E}$, e the electron charge, and $m_e$ the mass of the electron. The approximations made in solving Equation 1 are the following:

$$\frac{\partial}{\partial\phi} \sim O(1) \tag{5}$$

$$\frac{\overline{v}}{\Omega_e} \cdot \nabla \ll 1$$

$$\frac{1}{\Omega_e}\frac{e\overline{E}}{m_e} \cdot \nabla_v \ll 1$$

$$\frac{1}{\Omega_e}C(f) \ll 1$$

Setting $f = f_m + f_1$ with $f_1 \ll f_m$ gives by orders:

$$O(0): \frac{\partial f_m}{\partial\phi} = 0 \tag{6}$$

$$O(1): \frac{\partial f_1}{\partial\phi} = -\frac{1}{\Omega_e}\overline{v} \cdot \nabla f_m + \frac{1}{\Omega_e}\frac{e}{m_e}\overline{E} \cdot \nabla_v f_m + \frac{1}{\Omega_e}C(f_1)$$

Solving for $f_1$ yields:

$$f_1 = \left(\frac{v_z\overline{z}}{v'} + \frac{1}{1 + (v'/\Omega_e)^2}\left(\frac{1}{\Omega_e}\left(\frac{v'}{\Omega_e}\overline{v_\perp} - \overline{v}x\overline{z}\right)\right)\right) \cdot \overline{G}f_m \tag{7}$$

where $v_z$ is the z component of the velocity and $\overline{z}$ is the unit vector in the z direction.

$$v' = v_{ei}(v) + v_{eO}(v) \tag{8}$$

$$\overline{G} = \nabla \ln p + 1/T_e \nabla \phi + (v^2/v_{thermal}^2 - 5/2)\nabla \ln T_e)$$

where $p=T_e n$ is the pressure, n is the number density and $T_e$ is the electron temperature. Since $f_m$ represents the thermal equilibrium distribution function, the heat flux depends only on $f_1$, the deviation of the distribution function from thermal equilibrium.

The particle and heat fluxes are given by:

$$\text{particle flux } \Gamma = \langle n\overline{v} \rangle \tag{9}$$

$$\text{heat flux } \overline{q} = \left\langle \frac{m}{2}v^2\overline{v}\right\rangle - \frac{5}{2}\Gamma T$$

$$\text{where} \langle \overline{h}(\overline{v})\rangle \equiv \int d^3v \, \overline{h}(\overline{v})(f_m + f_1)$$

$\overline{h}(\overline{v})$ being an arbitrary velocity distribution function. The thermal conductivity is defined by the equation:

$$\overline{q} = -\overline{\overline{K}} \cdot \nabla T \tag{10}$$

where $\overline{\overline{K}}$ is the thermal conductivity tensor and $\overline{q}'$ is the portion of the heat flux driven by the temperature gradient. Therefore, to calculate $\overline{\overline{K}}$ only the $\nabla \ln T_e$ term in $\overline{G}$ (i.e. $(\eta^2 - 5/2) \Delta \ln T_e$) needs to be considered. The x and z components of K are found to be:

$$K_x = -\frac{4}{3\sqrt{\Pi}} n e_{v_{th}^2} \left[ \int_0^\infty d\eta \eta^4 (\eta^2 - 5/2)^2 \frac{(\beta\eta^{-3} + \gamma\eta^3)}{\Omega_e^2 + (\beta\eta^{-3} + \gamma\eta^3)^2} e^{-\eta^2} \right] \tag{11}$$

$$K_z = -\frac{4}{3\sqrt{\Pi}} n e_{v_{th}^2} \left[ \int_0^\infty d\eta \eta^4 \frac{(\eta^2 - 5/2)^2}{(\beta\eta^{-3} + \gamma\eta^3)} e^{-\eta^2} \right] \tag{12}$$

where $$\eta = \frac{v}{v_{th}} \tag{13}$$

$$v' = \beta\eta^{-3} + \gamma\eta^3$$

$$\beta = 2.91 \times 10^{-6} \ln \Lambda n_e T_e^{-3/2}$$

$$\gamma = 1.1 \times 10^{-9} T_e^{3/2} n_0$$

and $\gamma$ is given for argon gas.

The integrals over $\eta$ are easily evaluated numerically. Note that the $\gamma\eta^3$ term for the collisions with argon atoms may be replaced with any scalar velocity dependent collision frequency. This allows collisions with any neutral gas to be calculated.

I claim:

1. A method of controlling plasma uniformity during plasma processing of a substrate comprising:

providing a process chamber containing a plasma and said substrate; and generating a low magnetic field less than or equal to 20 gauss proximate to said substrate and substantially parallel to said substrate in said process chamber, wherein said low magnetic field acts to direct a heat flow in said plasma to control uniformity of said plasma.

2. The method of claim 1 wherein said low magnetic field is generated by a plurality of energized magnetic coils in a bucking configuration.

3. The method of claim 1 wherein said low magnetic field is a highly flared magnetic field.

4. The method of claim 1 wherein said plasma has a density less than $1.0 \times 10^{12}$ electrons/cm$^3$.

5. The method of claim 1 wherein said process chamber is at a pressure less than 5 mTorr.

6. A structure for use in the processing of a substrate, said structure comprising:

a process chamber for holding said substrate to be operated upon by said plasma, said process chamber having a first and second surface; and a first and a second magnetic field coil said first magnetic field coil proximate to said first surface of said process chamber and said second magnetic field coil proximate to said second surface of said process chamber;

said first and second magnetic field coils being configured for generating in said process chamber a low magnetic field that is proximate to said substrate surface and substantially parallel to said substrate surface said low magnetic field directing a flow of heat in said process chamber to control uniformity of said plasma;

wherein said process chamber has a substantially square circumference and wherein permanent magnets are positioned proximate to said process chamber and around said substantially square circumference of said process chamber.

* * * * *